(12) United States Patent
Cao et al.

(10) Patent No.: US 10,719,684 B2
(45) Date of Patent: Jul. 21, 2020

(54) FINGERPRINT IDENTIFICATION CIRCUIT, METHOD FOR MANUFACTURING FINGERPRINT IDENTIFICATION CIRCUIT, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Zhonglin Cao, Beijing (CN); Weiyun Huang, Beijing (CN); Shan Gao, Beijing (CN); Yang Wang, Beijing (CN); Tingliang Liu, Beijing (CN); Yuanjie Xu, Beijing (CN); Ting Li, Beijing (CN); Pengcheng Zang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 125 days.

(21) Appl. No.: 16/043,923

(22) Filed: Jul. 24, 2018

(65) Prior Publication Data

US 2019/0205602 A1    Jul. 4, 2019

(30) Foreign Application Priority Data

Jan. 3, 2018   (CN) .......................... 2018 1 0004143

(51) Int. Cl.
*G06K 9/00*    (2006.01)
*G03F 7/00*    (2006.01)
(Continued)

(52) U.S. Cl.
CPC ......... *G06K 9/0004* (2013.01); *G03F 7/0007* (2013.01); *G06F 3/0412* (2013.01);
(Continued)

(58) Field of Classification Search
CPC .... G06K 9/0004; G06K 9/001; G03F 7/0007; G06F 3/0412; G06F 3/0421
See application file for complete search history.

(56) References Cited

U.S. PATENT DOCUMENTS

| 9,733,569 B2* | 8/2017 | Son ................... G02B 5/1866 |
| 10,181,070 B2* | 1/2019 | Smith ................ G02B 5/005 |
| 2013/0141476 A1* | 6/2013 | Wu ..................... G09G 3/003 |
| | | 345/690 |
| 2015/0015517 A1* | 1/2015 | Zhao .................. G06F 3/041 |
| | | 345/173 |

(Continued)

FOREIGN PATENT DOCUMENTS

| CN | 105044974 A | 11/2015 |
| CN | 105550664 A | 5/2016 |

(Continued)

OTHER PUBLICATIONS

First Office Action for Chinese Application No. 201810004143.8, dated Oct. 28, 2019, 9 Pages.

*Primary Examiner* — Utpal D Shah
(74) *Attorney, Agent, or Firm* — Brooks Kushman P.C.

(57) ABSTRACT

A fingerprint identification circuit, a method for manufacturing the fingerprint identification circuit, and a display device are provided. The fingerprint identification circuit includes: an array substrate and an opposite substrate arranged opposite to the array substrate; a fingerprint identification member arranged at a side of the array substrate proximate to the opposite substrate; and a backlight source arranged at a side of the array substrate distal to the opposite substrate. A light-shielding member and a partially-transparent member are arranged on the opposite substrate. An orthogonal projection of the partially-transparent member onto the array substrate at least partially overlaps an (Continued)

orthogonal projection of the fingerprint identification member onto the array substrate.

18 Claims, 2 Drawing Sheets

(51) Int. Cl.
    *G06F 3/042*     (2006.01)
    *G06F 3/041*     (2006.01)
    *H01L 27/12*     (2006.01)

(52) U.S. Cl.
    CPC ........... *G06F 3/0421* (2013.01); *G06K 9/001* (2013.01); *G03F 7/0012* (2013.01); *G06K 2009/0006* (2013.01); *H01L 27/124* (2013.01)

(56) References Cited

U.S. PATENT DOCUMENTS

| | | | |
|---|---|---|---|
| 2016/0259443 A1* | 9/2016 | Yang | G06F 3/044 |
| 2016/0274715 A1* | 9/2016 | Wang | G02F 1/13 |
| 2017/0115799 A1* | 4/2017 | Shih | G06F 3/0412 |
| 2018/0005006 A1* | 1/2018 | Chai | G06K 9/0004 |
| 2018/0211085 A1 | 7/2018 | Liu et al. | |
| 2018/0260602 A1* | 9/2018 | He | G06K 9/0008 |
| 2018/0276444 A1 | 9/2018 | Sun et al. | |
| 2019/0006441 A1* | 1/2019 | Ling | H01L 51/5206 |
| 2019/0026530 A1 | 1/2019 | Wu et al. | |

FOREIGN PATENT DOCUMENTS

| | | |
|---|---|---|
| CN | 105678255 A | 6/2016 |
| CN | 106022324 A | 10/2016 |
| CN | 106847872 A | 6/2017 |
| CN | 107273821 A | 10/2017 |

* cited by examiner

FINGERPRINT IDENTIFICATION CIRCUIT, METHOD FOR MANUFACTURING FINGERPRINT IDENTIFICATION CIRCUIT, AND DISPLAY DEVICE

CROSS-REFERENCE TO RELATED APPLICATION

This application claims priority to Chinese Patent Application No. 201810004143.8 filed on Jan. 3, 2018, which is incorporated herein by reference in its entirety.

TECHNICAL FIELD

The present disclosure relates to the field of fingerprint identification technology, in particular to a fingerprint identification circuit, a method for manufacturing the fingerprint identification circuit and a display device.

BACKGROUND

Recently, along with the rapid development of the technology, mobile products having a biometric identification function have been gradually used in our daily lives. Fingerprint technology has attracted more and more attentions due to the uniqueness of a fingerprint. Push-type and swipe-type fingerprint identification techniques using a silicon-based process have been integrated into the mobile products, and in future, the focus is on the fingerprint identification technique at a display region.

In the related art, a fingerprint identification circuit having the fingerprint identification function typically includes a fingerprint identification member and an array control circuit. During the operation, the fingerprint identification member receives light beams reflected by valleys and ridges of the fingerprint of a user, and then the reflected light beams are scanned and analyzed by the array control circuit, so as to identify the fingerprint.

However, for the fingerprint identification circuit in the related art, in order to enable the fingerprint identification member to receive the light beams reflected by the valleys and ridges of the fingerprint, no black matrix is arranged at a region corresponding to the fingerprint identification member to prevent from shielding the reflected light beams. In the case that the fingerprint identification circuit is not in a fingerprint identifying operation, an external ambient light beam may pass through this region and arrives at the fingerprint identification member, so a service life and reliability of the fingerprint identification member may be adversely affected.

SUMMARY

An object of the present disclosure is to provide a fingerprint identification circuit, a method for manufacturing the fingerprint identification circuit, and a display device In one aspect, the present disclosure provides in some embodiments a fingerprint identification circuit, including: an array substrate and an opposite substrate arranged opposite to the array substrate; a fingerprint identification member arranged at a side of the array substrate proximate to the opposite substrate; and a backlight source arranged at a side of the array substrate distal to the opposite substrate. The opposite substrate comprises a light-shielding member and a partially-transparent member. An orthogonal projection of the partially-transparent member onto the array substrate at least partially overlaps an orthogonal projection of the fingerprint identification member onto the array substrate.

In a possible embodiment of the present disclosure, the orthogonal projection of the partially-transparent member onto the array substrate completely overlaps the orthogonal projection of the fingerprint identification member onto the array substrate.

In a possible embodiment of the present disclosure, the partially-transparent member includes a plurality of strip-like light-shielding patterns spaced apart from each other.

In a possible embodiment of the present disclosure, a distance between two adjacent strip-like light-shielding patterns is greater than or equal to a width of a single strip-like light-shielding pattern.

In a possible embodiment of the present disclosure, the plurality of strip-like light-shielding patterns is spaced apart from each other at a same interval.

In a possible embodiment of the present disclosure, each strip-like light-shielding pattern is made of a metal material or a black matrix material.

In a possible embodiment of the present disclosure, the light-shielding member includes a metal layer made of a metal material or a black matrix layer made of a black matrix material.

In a possible embodiment of the present disclosure, the fingerprint identification circuit further serves as a display panel. The display panel includes a display region and a non-display region. The orthogonal projection of the partially-transparent member onto the array substrate is located within an orthogonal projection of the display region onto the array substrate.

In a possible embodiment of the present disclosure, the light-shielding member and the partially-transparent member are arranged at a same layer in such a manner as to adjoin each other.

In another aspect, based on the above-mentioned fingerprint identification circuit, the present disclosure provides in some embodiments a display device including the above-mentioned fingerprint identification circuit.

In yet another aspect, based on the above-mentioned fingerprint identification circuit, the present disclosure provides in some embodiments a method for manufacturing the above-mentioned fingerprint identification circuit, including forming the light-shielding member and the partially-transparent member on the opposite substrate. An orthogonal projection of the partially-transparent member onto the array substrate at least partially overlaps an orthogonal projection of the fingerprint identification member onto the array substrate.

In a possible embodiment of the present disclosure, the light-shielding member includes a black matrix layer, and the partially-transparent member includes a plurality of strip-like light-shielding patterns spaced apart from each other. The step of forming the light-shielding member and the partially-transparent member on the opposite substrate includes: forming the black matrix layer and the strip-like light-shielding patterns on the opposite substrate using a black matrix material through a single patterning process.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

Figure 1:
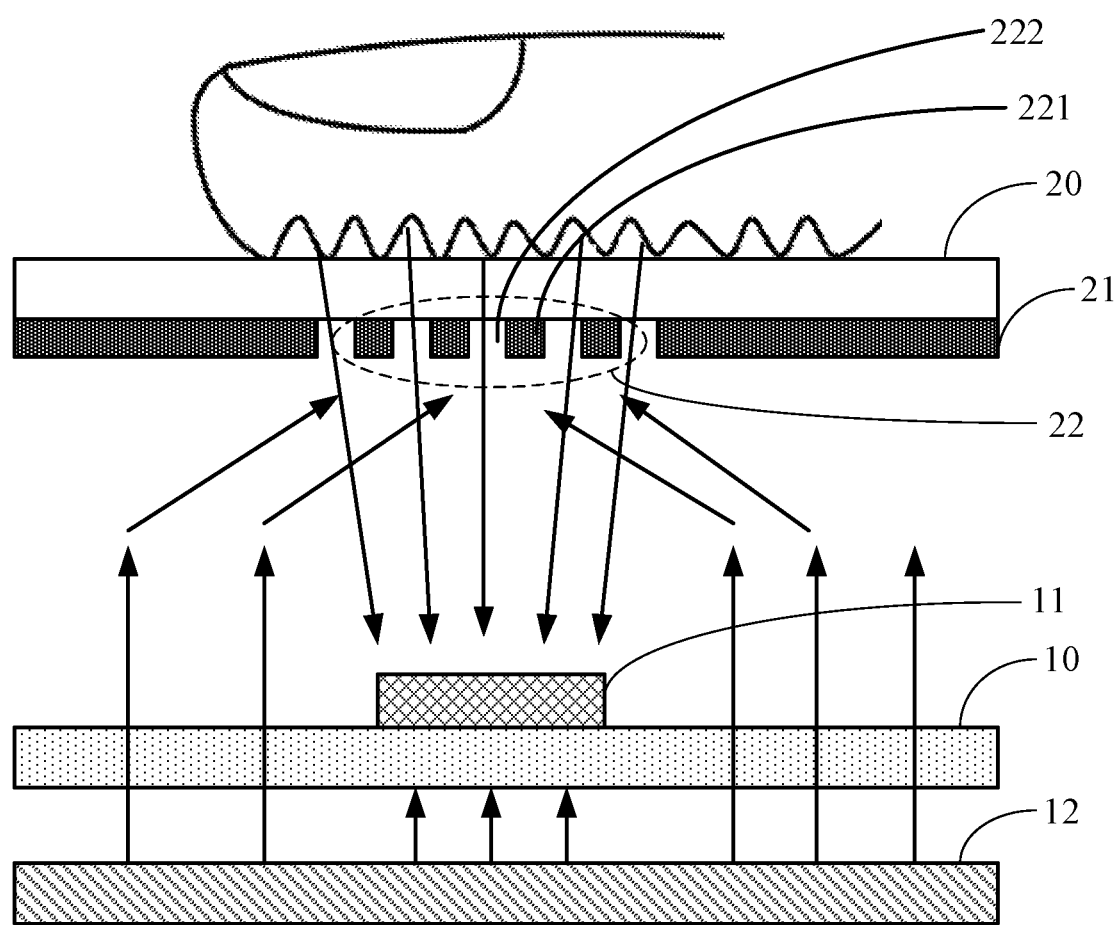
FIG. 1 is a sectional view of a fingerprint identification circuit according to one embodiment of the present disclosure.

REFERENCE SIGN LIST 10 array substrate
11 fingerprint identification member
12 backlight source
20 opposite substrate
21 light-shielding member
22 partially-transparent member
221 strip-like light-shielding pattern
222 transparent member

DETAILED DESCRIPTION

The present disclosure will be described hereinafter in conjunction with the drawings and embodiments, so as to further explain the fingerprint identification circuit, the method for manufacturing the fingerprint identification circuit and the display device.

Figure 2:
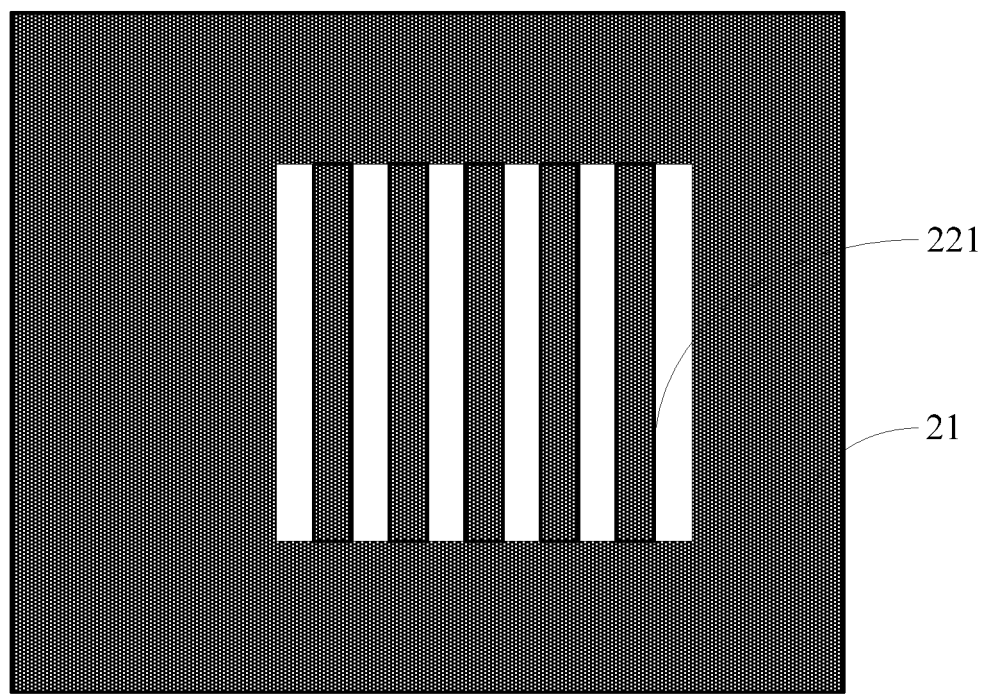
FIG. 2 is a top view of a partially-transparent member on an opposite substrate according to one embodiment of the present disclosure.

As shown in FIGS. 1 and 2, the present disclosure provides in some embodiments a fingerprint identification circuit, including an array substrate 10, an opposite substrate 20 arranged opposite to the array substrate 10, a fingerprint identification member 11 arranged at a side of the array substrate 10 proximate to the opposite substrate 20, and a backlight source 12 arranged at a side of the array substrate 10 distal to the opposite substrate 20. A light-shielding member 21 and a partially-transparent member 22 are arranged on the opposite substrate 20. The light-shielding member 21 and the partially-transparent member 22 are arranged at a same layer in such a manner as to adjoin each other. An orthogonal projection of the partially-transparent member 22 onto the array substrate 10 at least partially overlaps an orthogonal projection of the fingerprint identification member 11 onto the array substrate 10.

During the fingerprint identification through the fingerprint identification circuit, a finger of a user is placed on the partially-transparent member 22. Light beams from the backlight source 12 pass through the array substrate 10 towards the opposite substrate 20, then through the partially-transparent member 22 on the opposite substrate 20 to arrive at the finger placed on the partially-transparent member 22, and then are reflected by valleys and ridges of a fingerprint of the finger, and the reflected light beams are received by the fingerprint identification member 11 on the array substrate 10. The reflected light beams received by the fingerprint identification member 11 are then scanned and analyzed by an array circuit on the array substrate 10, so as to identify the user's fingerprint. In the case that the fingerprint identification circuit is not in a fingerprint identifying operation, the fingerprint identification member 11 may be shielded by the partially-transparent member 22 on the opposite substrate 20 to some extent, so as to prevent the fingerprint identification member 11 from being irradiated by too many ambient light beams, thereby to protect the fingerprint identification member 11.

Based on the structure and usage of the fingerprint identification circuit, in the fingerprint identification circuit according to the embodiments of the present disclosure, the light-shielding member 21 and the partially-transparent member 22 are arranged on the opposite substrate 20, and the orthogonal projection of the partially-transparent member 22 onto the array substrate 10 at least partially overlaps the orthogonal projection of the fingerprint identification member 11 onto the base substrate 10. The partially-transparent member 22 on the opposite substrate 20 is capable of partially allowing the light beams to pass therethrough, so during the fingerprint identification of the fingerprint identification circuit, the light beams from the backlight source 12 may pass through the array substrate 10 and the partially-transparent member 22 sequentially to arrive at the valleys and ridges of the user's fingerprint. In addition, because the orthogonal projection of the partially-transparent member 22 onto the array substrate 10 at least partially overlaps the orthogonal projection of the fingerprint identification member 11 onto the array substrate 10, the light beams reflected by the valleys and ridges of the user's fingerprint may be received by the fingerprint identification member 11 and then scanned and analyzed by the array circuit on the array substrate 10, so as to identify the user's fingerprint. In the case that the fingerprint identification circuit is not in a fingerprint identifying operation, merely parts of the external ambient light beams are allowed to pass through the partially-transparent member 22 on the opposite substrate 20, so it is able to reduce an intensity of the external ambient light beams irradiated onto the fingerprint identification member 11, and the negative effect of the irradiation of the external ambient light beams onto the fingerprint identification member 11 is weaken, thereby to effectively prolong a service life of the fingerprint identification circuit 11, and improve the reliability of the fingerprint identification member 11. In a word, it is able for the fingerprint identification circuit in the embodiments of the present disclosure to not only achieve a fingerprint identification function but also improve the service life and reliability of the fingerprint identification member 11.

Further, the orthogonal projection of the partially-transparent member 22 onto the array substrate 10 may completely overlap the orthogonal projection of the fingerprint identification member 11 onto the array substrate 10. In this way, it is able to increase an area of the fingerprint identification member 11 for receiving the light beams reflected by the valleys and ridges of the fingerprint, thereby to improve the fingerprint identification accuracy during the fingerprint identification of the fingerprint identification circuit.

Referring to FIGS. 1 and 2 again, the partially-transparent member 22 may be of various structures. For example, the partially-transparent member 22 may include a plurality of strip-like light-shielding patterns 221 spaced apart from each other and a plurality of transparent portions 222 each arranged between respective two adjacent strip-like light-shielding patterns 221. Through this structure, the transparent portions 222 and the non-transparent portions (i.e., the strip-like light-shielding patterns 221) of the partially-transparent member 22 may be arranged alternately and evenly, so as to increase the uniformity of the light beams reflected by the valleys and ridges of the user's fingerprint and ensure the fingerprint identification accuracy of the fingerprint identification circuit. In addition, it is able to ensure the fingerprint identification member 11 to be evenly irradiated by the external ambient light beams passing through the partially-transparent member 22, and prevent the fingerprint identification member 11 from being directly irradiated by the external ambient light beams at a large intensity, thereby to improve the service life and the reliability of the fingerprint identification member 11. In a possible embodiment of the present disclosure, the plurality of strip-like light-shielding patterns 221 may be spaced apart from each other at a same interval, so as to further improve the fingerprint identification accuracy of the fingerprint identification circuit as well as the service life and reliability of the fingerprint identification member 11 in the fingerprint identification circuit.

Further, a distance between two adjacent strip-like light-shielding patterns 221 may be greater than or equal to a width of a single strip-like light-shielding pattern 221. In this way, an area of the transparent portions 222 of the partially-transparent member 22 is greater than or equal to an area of the non-transparent portion 221 of the partially-transparent member 22 (i.e., a light transmittance of the partially-transparent member 22 is greater than or equal to 50%). As a result, during the fingerprint identification of the fingerprint identification circuit, it is able for the fingerprint identification member 11 on the array substrate 10 to receive the reflected light beams as many as possible, thereby to further improve the fingerprint identification accuracy of the fingerprint identification circuit.

It should be appreciated that, the plurality of strip-like light-shielding patterns 221 may be arranged in various ways. The number of the strip-like light-shielding patterns 221 and the distance between the two adjacent strip-like light-shielding patterns 221 may be set in accordance with the practical need, so as to control the amount of the light beams reflected by the partially-transparent member 22 and the light transmittance of the partially-transparent member 22 for the external ambient light beams, thereby to improve the service life and the reliability of the fingerprint identification member 11 while ensuring the fingerprint identification accuracy.

In addition, due to the partially-transparent member 22, the intensity of the light beams reflected by the valleys and ridges of the fingerprint to the fingerprint identification member 11 may be reduced. In order to solve this problem, the backlight source 12 arranged at the side of the array substrate 10 distal to the opposite substrate 20 may be a backlight source with adjustable illumination brightness. In this way, during the fingerprint identification, the intensity of the light beams from the backlight source may be increased, so as to increase the amount of the light beams reflected by the valleys and ridges of the fingerprint to the fingerprint identification member 11 to obtain the desired intensity of the light beam and ensure the fingerprint information collecting capability of the fingerprint identification member 11, thereby to ensure the fingerprint identification accuracy. In the case that the fingerprint identification circuit is not in a fingerprint identifying operation, the backlight source 12 may be turned off. At this time, the ambient light beams may be partially shielded by the partially-transparent member 22, so it is able to significantly improve the service life and reliability of the fingerprint identification member 11.

The plurality of strip-like light-shielding patterns 221 may be made of various materials. In a possible embodiment of the present disclosure, the strip-like light-shielding patterns 221 may be made of a metal material or a black matrix material. Each transparent member 222 may not be filled with any material (i.e., it may be an air gap), or it may be filled with a transparent material.

To be specific, in the case that the light-shielding member 21 on the opposite substrate 20 includes a metal layer made of a metal material, the strip-like light-shielding patterns may be made of the metal material too. In this way, it is able to form the metal layer and the strip-like light-shielding patterns using the metal material through a single patterning process. Alternatively, in the case that the light-shielding member 21 on the opposite substrate 20 includes a black matrix layer made of a black matrix material, the strip-like light-shielding patterns may be made of the black matrix material too. In this way, it is able to form the black matrix layer and the strip-like light-shielding patterns using the black matrix material through a single patterning process. As a result, it is unnecessary to provide an additional patterning process to form the strip-like light-shielding patterns 221, thereby it is able to effectively reduce the manufacture cost of the fingerprint identification circuit.

Further, in the case that the fingerprint identification circuit further serves as a display panel, the display panel includes a display region and a non-display region, and the orthogonal projection of the partially-transparent member 22 onto the array substrate 10 is located within the orthogonal projection of the display region onto the array substrate 10.

To be specific, in the case that the orthogonal projection of the partially-transparent member 22 onto the array substrate 10 is located within the orthogonal projection of the display region onto the array substrate 10, it is able to prevent the fingerprint identification member 11 of the fingerprint identification circuit from occupying an additional space while ensuring a normal display function and the fingerprint identification function of the fingerprint identification circuit as well as improving the service life and reliability of the fingerprint identification circuit, thereby to provide a product of the fingerprint identification circuit with a narrow bezel.

In addition, the fingerprint identification member 11 may be, but not limited to, a photodiode sensor.

The present disclosure further provides in some embodiments a display device including the above-mentioned fingerprint identification circuit.

As mentioned above, it is able for the fingerprint identification circuit to achieve the fingerprint identification function and improve the service life and reliability of the fingerprint identification member 11. The display device includes the above-mentioned fingerprint identification circuit, so it may also have fairly good fingerprint identification performance.

The present disclosure further provides in some embodiments a method for manufacturing the above-mentioned fingerprint identification circuit, including a step of forming the light-shielding member 21 and the partially-transparent member 22 on the opposite substrate 20. The light-shielding member 21 and the partially-transparent member 22 are arranged at a same layer in such a manner as to adjoin each other. An orthogonal projection of the partially-transparent member 22 onto the array substrate 10 at least partially overlaps an orthogonal projection of the fingerprint identification member 11 onto the array substrate 10.

According to the fingerprint identification circuit manufactured by the method in the embodiments of the present disclosure, the light-shielding member 21 and the partially-transparent member 22 are arranged on the opposite substrate 20, and the orthogonal projection of the partially-transparent member 22 onto the array substrate 10 at least partially overlaps the orthogonal projection of the fingerprint identification member 11 onto the base substrate 10. The partially-transparent member 22 on the opposite substrate 20 is capable of partially allowing the light beams to pass therethrough, so during the fingerprint identification of the fingerprint identification circuit, the light beams from the backlight source 12 may pass through the array substrate 10 and the partially-transparent member 22 sequentially to arrive at the valleys and ridges of the user's fingerprint. In addition, because the orthogonal projection of the partially-transparent member 22 onto the array substrate 10 at least partially overlaps the orthogonal projection of the fingerprint identification member 11 onto the array substrate 10, the light beams reflected by the valleys and ridges of the user's fingerprint may be received by the fingerprint identification member 11 and then scanned and analyzed by the array circuit on the array substrate 10, so as to identify the user's fingerprint. In the case that the fingerprint identification circuit is not in a fingerprint identifying operation, merely parts of the external ambient light beams are allowed to pass through the partially-transparent member 22 on the opposite substrate 20, so it is able to reduce an intensity of the external ambient light beams irradiated onto the fingerprint identification member 11, and the negative effect of the irradiation of the external ambient light beams onto the fingerprint identification member 11 is weaken, thereby to prolong a service life of the fingerprint identification circuit 11, and improve the reliability of the fingerprint identification member 11. In a word, it is able for the fingerprint identification circuit manufactured by the method in the embodiments of the present disclosure to not only achieve a fingerprint identification function but also effectively improve the service life and reliability of the fingerprint identification member 11 of the fingerprint identification circuit.

Further, the orthogonal projection of the partially-transparent member 22 onto the array substrate 10 may completely overlap the orthogonal projection of the fingerprint identification member 11 onto the array substrate 10. In this way, it is able to increase an area of the fingerprint identification member 11 for receiving the light beams reflected by the valleys and ridges of the fingerprint, thereby to improve the fingerprint identification accuracy during the fingerprint identification of the fingerprint identification circuit.

In the case that the light-shielding member 21 includes a black matrix layer and the partially-transparent member 22 includes a plurality of strip-like light-shielding patterns 221 spaced apart from each other, the step of forming the light-shielding member 21 and the partially-transparent member 22 on the opposite substrate 20 includes: forming the black matrix layer and the strip-like light-shielding patterns 221 on the opposite substrate 20 using a black matrix material through a single patterning process.

To be specific, a black matrix thin film may be formed using the black matrix material, so as to cover the entire opposite substrate 20. Then, the black matrix thin film may be exposed and developed, so as to form the black matrix layer of the light-shielding member 21 on the opposite substrate 20, and the plurality of strip-like light-shielding patterns 221 spaced apart from each other of the partially-transparent member 22 on the opposite substrate 20.

Further, in the case that the light-shielding member 21 on the opposite substrate 20 includes a metal layer made of a metal material, the strip-like light-shielding patterns may be made of the metal material too. In this way, it is able to form the metal layer and the strip-like light-shielding patterns using the metal material through a single patterning process.

Hence, according to the method for manufacturing the fingerprint identification circuit in the embodiments of the present disclosure, the black matrix layer and the plurality of strip-like light-shielding patterns may be formed simultaneously using the black matrix material through a single patterning process, or the metal layer and the plurality of strip-like light-shielding patterns may be formed simultaneously using the metal material through a single patterning process. As a result, it is unnecessary to provide an additional patterning process to form the strip-like light-shielding patterns 221, thereby it is able to effectively reduce the manufacture cost of the fingerprint identification circuit.

In a possible embodiment of the present disclosure, the plurality of strip-like light-shielding patterns 221 may be spaced apart from each other at a same interval, and a distance between two adjacent strip-like light-shielding patterns 221 may be greater than or equal to a width of a single strip-like light-shielding pattern 221. In addition, in the case that the fingerprint identification circuit is used for display, the orthogonal projection of the partially-transparent member onto the array substrate is located within an orthogonal projection of a display region onto the array substrate. The beneficial effects generated by these arrangement modes have been described hereinabove, and thus will not be particularly defined herein.

Unless otherwise defined, any technical or scientific term used herein shall have the common meaning understood by a person of ordinary skills. Such word as "first" and "second" used in the specification and claims is merely used to differentiate different components rather than to represent any order, number or importance. Similarly, such word as "including" or "include" is merely used to represent that the object or element existing before the word contains the object or element or the equivalent enumerated after the word, without excluding the possibility of further containing other objects or elements. Such word as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure. Therefore, a protection scope of the present application is defined by the attached claims.

What is claimed is:

1. A fingerprint identification circuit, comprising:
an array substrate and an opposite substrate arranged opposite to the array substrate;
a fingerprint identification member arranged at a side of the array substrate proximate to the opposite substrate; and
a backlight source arranged at a side of the array substrate distal to the opposite substrate,
wherein a light-shielding member and a partially-transparent member are arranged on the opposite substrate, and an orthogonal projection of the partially-transparent member onto the array substrate at least partially overlaps an orthogonal projection of the fingerprint identification member onto the array substrate, and the partially-transparent member comprises a plurality of strip-like light-shielding patterns spaced apart from each other.

2. The fingerprint identification circuit according to claim 1, wherein the orthogonal projection of the partially-transparent member onto the array substrate coincides with the orthogonal projection of the fingerprint identification member onto the array substrate.

3. The fingerprint identification circuit according to claim 1, wherein a distance between two adjacent ones of the strip-like light-shielding patterns is greater than or equal to a width of each of the strip-like light-shielding patterns.

4. The fingerprint identification circuit according to claim 1, wherein the strip-like light-shielding patterns are spaced apart from each other at a same interval.

5. The fingerprint identification circuit according to claim 1, wherein the strip-like light-shielding patterns are made of a metal material or a black matrix material.

6. The fingerprint identification circuit according to claim 1, wherein the light-shielding member includes a metal layer made of a metal material or a black matrix layer made of a black matrix material.

7. The fingerprint identification circuit according to claim 1, wherein the fingerprint identification circuit further serves as a display panel, the display panel comprises a display region and a non-display region, and the orthogonal projection of the partially-transparent member onto the array substrate is located within an orthogonal projection of the display region onto the array substrate.

8. The fingerprint identification circuit according to claim 1, wherein the light-shielding member and the partially-transparent member are arranged at a same layer and adjoin each other.

9. A display device, comprising the fingerprint identification circuit according to claim 1.

10. The display device according to claim 9, wherein the orthogonal projection of the partially-transparent member onto the array substrate coincides with the orthogonal projection of the fingerprint identification member onto the array substrate.

11. The display device according to claim 9, wherein a distance between two adjacent ones of the strip-like light-shielding patterns is greater than or equal to a width of each of the strip-like light-shielding patterns.

12. The display device according to claim 9, wherein the strip-like light-shielding patterns are spaced apart from each other at a same interval.

13. The display device according to claim 9, wherein the strip-like light-shielding patterns are made of a metal material or a black matrix material.

14. The display device according to claim 9, wherein the light-shielding member includes a metal layer made of a metal material or a black matrix layer made of a black matrix material.

15. The display device according to claim 9, wherein the fingerprint identification circuit further serves as a display panel, the display panel comprises a display region and a non-display region, and an orthogonal projection of the partially-transparent member onto the array substrate is located within an orthogonal projection of the display region onto the array substrate.

16. The display device according to claim 9, wherein the light-shielding member and the partially-transparent member are arranged at a same layer and adjoin each other.

17. A method for manufacturing the fingerprint identification circuit according to claim 1, comprising:
   forming the light-shielding member and the partially-transparent member on the opposite substrate, wherein an orthogonal projection of the partially-transparent member onto the array substrate at least partially overlaps an orthogonal projection of the fingerprint identification member onto the array substrate.

18. The method according to claim 17, wherein the light-shielding member comprises a black matrix layer, and the step of forming the light-shielding member and the partially-transparent member on the opposite substrate comprises: forming the black matrix layer and the strip-like light-shielding patterns on the opposite substrate using a black matrix material through a single patterning process.

* * * * *